(12) United States Patent
Masuda et al.

(10) Patent No.: US 11,004,877 B2
(45) Date of Patent: May 11, 2021

(54) SOLID-STATE IMAGING DEVICE WITH PHASE DIFFERENCE DETECTION PIXEL AND ELECTRONIC APPARATUS

(71) Applicant: SONY CORPORATION, Tokyo (JP)

(72) Inventors: Yoshiaki Masuda, Kanagawa (JP); Naoyuki Sato, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 42 days.

(21) Appl. No.: 15/025,160

(22) PCT Filed: Aug. 14, 2015

(86) PCT No.: PCT/JP2015/072947
§ 371 (c)(1),
(2) Date: Mar. 25, 2016

(87) PCT Pub. No.: WO2016/031592
PCT Pub. Date: Mar. 3, 2016

(65) Prior Publication Data
US 2017/0287960 A1    Oct. 5, 2017

(30) Foreign Application Priority Data

Aug. 29, 2014 (JP) .............................. JP2014-174869

(51) Int. Cl.
| | |
|---|---|
| *H01L 27/14* | (2006.01) |
| *H01L 31/0232* | (2014.01) |
| *H01L 27/146* | (2006.01) |
| *H04N 5/369* | (2011.01) |
| *G02B 1/113* | (2015.01) |
| *G02B 7/36* | (2021.01) |
| *H01L 31/0216* | (2014.01) |

(52) U.S. Cl.
CPC .............. *H01L 27/14* (2013.01); *G02B 1/113* (2013.01); *G02B 7/365* (2013.01);
(Continued)

(58) Field of Classification Search
CPC ........... H01L 27/14623; H01L 27/1462; H01L 27/14627; H01L 27/1464; H01L 31/02327
(Continued)

(56) References Cited

U.S. PATENT DOCUMENTS 6,285,424 B1 * 9/2001 Yoshida ................. G02B 5/201
349/106
8,445,985 B2 * 5/2013 Hiyama ............ H01L 27/14623
257/435
(Continued)

FOREIGN PATENT DOCUMENTS

JP        09-232552 A    9/1997
JP        2004-104203 A  4/2004
(Continued)

*Primary Examiner* — Robert T Huber
(74) *Attorney, Agent, or Firm* — Chip Law Group (57) ABSTRACT

A solid-state imaging device, for reduction of reflection of incident light at a sidewall surface of a light blocking layer of each phase difference detection pixel, includes: a normal pixel for generating a pixel signal; and a phase difference detection pixel for generating a phase difference signal for image plane phase difference AF. In this solid-state imaging device, the normal pixel and the phase difference detection pixel each include a photoelectric conversion layer and a lens for gathering incident light onto the photoelectric conversion layer, the phase difference detection pixel includes a light blocking layer having an apertural portion with an aperture deviating from the optical axis of the lens, and an antireflection portion that prevents reflection of the incident light gathered by the lens unit is formed on the light blocking layer. The present disclosure can be applied to back-illuminated CISs.

6 Claims, 7 Drawing Sheets

(52) U.S. Cl.
CPC ...... *H01L 27/1462* (2013.01); *H01L 27/1464* (2013.01); *H01L 27/14605* (2013.01); *H01L 27/14621* (2013.01); *H01L 27/14623* (2013.01); *H01L 27/14627* (2013.01); *H01L 27/14645* (2013.01); *H01L 31/02327* (2013.01); *H04N 5/3696* (2013.01); *H04N 5/36961* (2018.08); *H01L 31/02162* (2013.01); *H01L 31/02164* (2013.01)

(58) Field of Classification Search
USPC .................................. 257/432, 437, E31.127
See application file for complete search history.

(56) References Cited

U.S. PATENT DOCUMENTS

2008/0297634 A1* 12/2008 Uya .................. H01L 27/14623
348/294
2012/0273854 A1 11/2012 Velichko et al.
2012/0293707 A1* 11/2012 Nagano .............. H04N 5/23212
348/345
2014/0078359 A1* 3/2014 Lenchenkov ..... H01L 27/14627
348/294

FOREIGN PATENT DOCUMENTS

| | | |
|---|---|---|
| JP | 2005-005540 A | 1/2005 |
| JP | 2009-272747 A | 11/2009 |
| JP | 2010-129786 A | 6/2010 |
| JP | 2010-193073 A | 9/2010 |
| JP | 2011-176715 A | 9/2011 |
| JP | 2011-243735 A | 12/2011 |
| JP | 2012-124377 A | 6/2012 |
| JP | 2012-242530 A | 12/2012 |
| JP | 2012-248682 A | 12/2012 |
| JP | 2013-157622 A | 8/2013 |
| JP | 2013-175582 A | 9/2013 |
| JP | 2013-207053 A | 10/2013 |

* cited by examiner

SOLID-STATE IMAGING DEVICE WITH PHASE DIFFERENCE DETECTION PIXEL AND ELECTRONIC APPARATUS

TECHNICAL FIELD

The present disclosure relates to solid-state imaging devices and electronic apparatuses. More particularly, the present disclosure relates to a solid-state imaging device to be preferably used in cases where phase difference detection pixels for realizing an image plane phase difference automatic focus (AF) function are provided in addition to normal pixels for obtaining pixel signals, and to an electronic apparatus.

BACKGROUND ART

Image plane phase difference AF is known as a method of AF (see Patent Document 1, for example). In a solid-state imaging element that realizes image plane phase difference AF, a phase difference detection pixel for subjecting incident light to pupil splitting is provided in a predetermined position, in addition to a normal pixel for obtaining a pixel signal.

Figure 1:
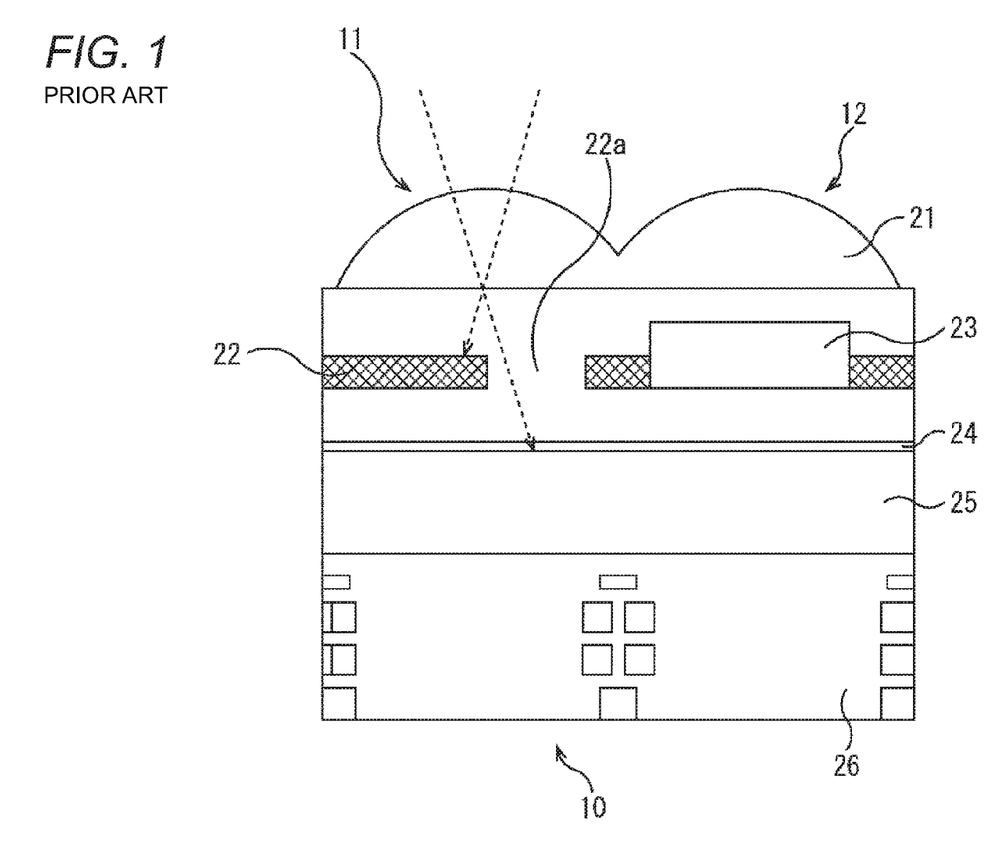
FIG. 1 is a cross-sectional block diagram showing an example conventional structure of a back-illuminated CIS in which a phase difference detection pixel is provided.

FIG. 1 is a cross-sectional block diagram showing an example conventional structure of a back-illuminated CMOS Image Sensor (CIS) in which a phase difference detection pixel is provided. In this drawing, the left side is a phase difference detection pixel 11, and the right side is a normal pixel 12.

The phase difference detection pixel 11 and the normal pixel 12 each include an on-chip lens 21, an antireflection layer 24, a photoelectric conversion layer 25, and an interconnect layer 26, in this order from the upper layer side (the light incidence surface side).

In the phase difference detection pixel 11, a light blocking layer 22 having an apertural portion 22a that is an aperture deviating from the optical axis of the on-chip lens 21 is formed between the on-chip lens 21 and the antireflection layer 24.

Meanwhile, in the normal pixel 12, a color filter 23 is provided between the on-chip lens 21 and the antireflection layer 24. The color filter 23 may also be provided in the phase difference detection pixel 11.

Ideally, in the phase difference detection pixel 11, incident light that should be blocked is completely blocked by the light blocking layer 22, and incident light that should be received preferably enters the photoelectric conversion layer 25 through the apertural portion 22a, as shown in FIG. 1.

CITATION LIST

Patent Document

Patent Document 1: Japanese Patent Application Laid-Open No. 2013-157622

SUMMARY OF THE INVENTION

Problems to be Solved by the Invention

Figure 2:
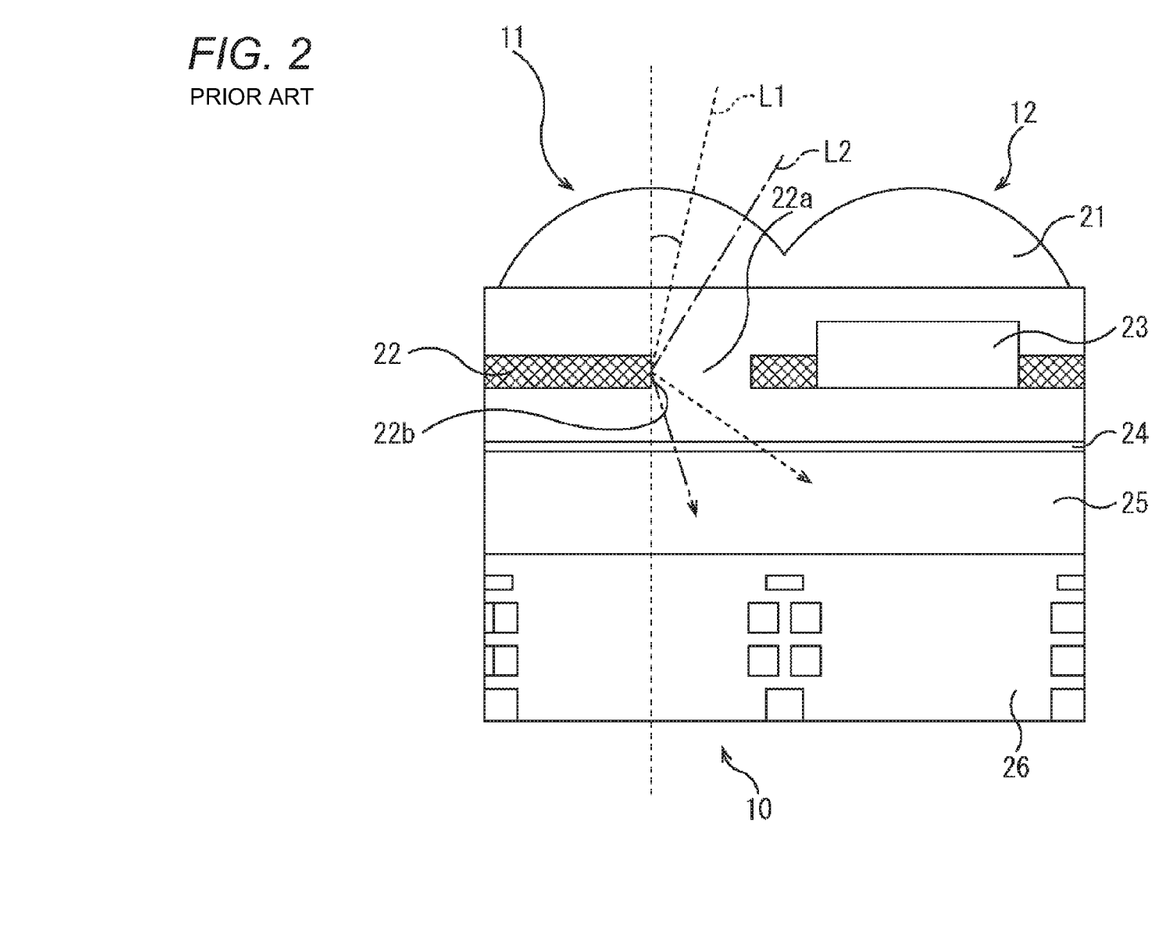
FIG. 2 is a diagram for explaining reflection of incident light at the sidewall surface of a light blocking layer in the back-illuminated CIS shown in FIG. 1.

In reality, however, there exists incident light reflected by the sidewall surface 22b of the light blocking layer 22, as shown in FIG. 2. When the reflected light enters the photoelectric conversion layer 25 of the phase difference detection pixel 11, like reflected light of incident light L1, phase difference detection performance becomes poorer. When the reflected light enters the photoelectric conversion layer 25 of the adjacent normal pixel 12, like reflected light of incident light L2, color mixing is caused.

Reflection of incident light at the sidewall surface 22b of the light blocking layer 22 of the phase difference detection pixel 11 described above is more conspicuous in the back-illuminated CIS 10 than in a surface-illuminated CIS. For comparison, an example structure of a surface-illuminated CIS is described below.

Figure 3:
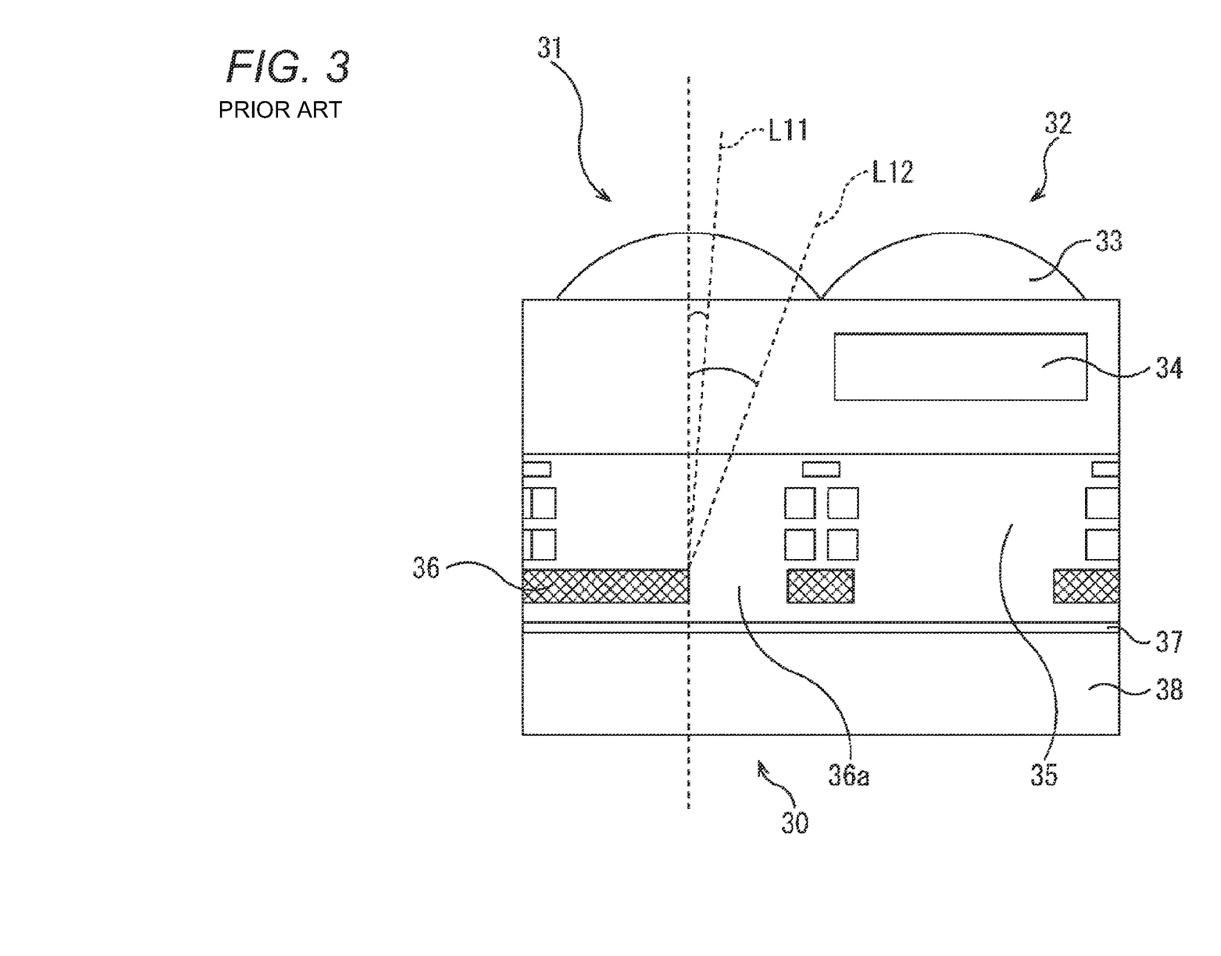
FIG. 3 is a cross-sectional block diagram showing an example conventional structure of a surface-illuminated CIS in which a phase difference detection pixel is provided.

FIG. 3 is a cross-sectional block diagram showing an example conventional structure of a surface-illuminated CIS in which a phase difference detection pixel is provided. In this drawing, the left side is a phase difference detection pixel 31, and the right side is a normal pixel 32.

The phase difference detection pixel 31 and the normal pixel 32 each include an on-chip lens 33, an interconnect layer 35, an antireflection layer 37, and a photoelectric conversion layer 38, in this order from the upper layer side (the light incidence surface side).

In the phase difference detection pixel 31, a light blocking layer 36 having an apertural portion 36a with an aperture deviating from the optical axis of the on-chip lens 33 is provided in the interconnect layer 35. Meanwhile, in the normal pixel 32, a color filter 34 is provided between the on-chip lens 33 and the interconnect layer 35. The color filter 34 may also be provided in the phase difference detection pixel 31.

As shown in the drawing, in the surface-illuminated CIS 30, incident light gathered by the on-chip lens 33 enters the photoelectric conversion layer 38 via the interconnect layer 35, and accordingly, the distance from the on-chip lens 33 to the photoelectric conversion layer 38 is longer than that in the back-illuminated CIS 10. Thus, the angle between a principal ray L11 of the incident light and the optical axis is smaller than that in the back-illuminated CIS 10. The on-chip lens 33 is designed to have a smaller curvature than the curvature of the on-chip lens 21 of the back-illuminated CIS 10, and therefore, the angle between a peripheral ray L12 of the incident light and the optical axis of the on-chip lens 33 is smaller than that in the back-illuminated CIS 10.

In other words, in the back-illuminated CIS 10, the vignetting due to the interconnect layer 26 is smaller, and tolerance to oblique incidence of light is higher than in the surface-illuminated CIS 30. Thus, the angle between the principal ray L1 of incident light and the optical axis is larger than that in the back-illuminated CIS 10. Also, the on-chip lens 21 has a larger curvature than the curvature of the on-chip lens 33 of the surface-illuminated CIS 30, and therefore, the angle between the peripheral ray L2 of incident light and the optical axis of the on-chip lens 21 is larger than that in the surface-illuminated CIS 30.

The above facts indicate that, in the back-illuminated CIS 10, reflection of incident light at the sidewall surface 22b of the light blocking layer 22 of the phase difference detection pixel 11 occurs more easily than in the surface-illuminated CIS 30. To counter this, some measures need to be taken.

The present disclosure is made in view of those circumstances, and is to reduce reflection of incident light at the sidewall surface of the light blocking layer of each phase difference detection pixel.

Solutions to Problems

A solid-state imaging device according to a first aspect of the present disclosure includes: a normal pixel for generating a pixel signal; and a phase difference detection pixel for generating a phase difference signal for image plane phase difference AF. In this solid-state imaging device, the normal pixel and the phase difference detection pixel each include a photoelectric conversion layer and a lens for gathering incident light onto the photoelectric conversion layer, the phase difference detection pixel includes a light blocking layer having an apertural portion with an aperture deviating from the optical axis of the lens, and an antireflection portion that prevents reflection of the incident light gathered by the lens unit is formed on the light blocking layer.

The antireflection portion may be an antireflection film formed on the sidewall surface of the light blocking layer facing the apertural portion.

The antireflection portion may be the antireflection film further formed on the upper surface of the light blocking layer on the side of the lens.

The light blocking layer may be made of a metal, and the antireflection film may be made of a metal oxide formed by subjecting the metal to an oxidation treatment.

The light blocking layer may be made of W, and the antireflection film may be made of WOx formed by subjecting the W to an oxidation treatment.

The antireflection portion may be a tapered portion in which the light blocking layer becomes thinner in the direction toward the apertural portion.

The normal pixel and the phase difference detection pixel may each further include an antireflection layer on the upper surface of the photoelectric conversion layer on the side of the lens, and the antireflection layer of the phase difference detection pixel may have a removed portion that is a portion selectively removed.

The light blocking layer may be thinner than a light blocking film formed in an OPB region.

The solid-state imaging device may be of a back-illuminated type.

An electronic apparatus according to a second aspect of the present disclosure is an electronic apparatus equipped with a solid-state imaging device. The solid-state imaging device includes: a normal pixel for generating a pixel signal; and a phase difference detection pixel for generating a phase difference signal for image plane phase difference AF. In this electronic apparatus, the normal pixel and the phase difference detection pixel each include a photoelectric conversion layer and a lens for gathering incident light onto the photoelectric conversion layer, the phase difference detection pixel includes a light blocking layer having an apertural portion with an aperture deviating from the optical axis of the lens, and an antireflection portion that prevents reflection of the incident light gathered by the lens unit is formed on the light blocking layer.

In the first and second aspects of the present disclosure, the antireflection portion formed with the light blocking layer prevents reflection of incident light gathered by the lens unit.

Effects of the Invention

According to the first and second aspects of the present disclosure, incident light gathered by the lens unit can be prevented from being reflected by the light blocking layer and entering the photoelectric conversion layer.

MODES FOR CARRYING OUT THE INVENTION

The following is a detailed description of the best mode for carrying out the present disclosure (hereinafter referred to as the embodiment), with reference to the drawings.

First Example Structure of a Back-Illuminated CIS as the Embodiment

Figure 4:
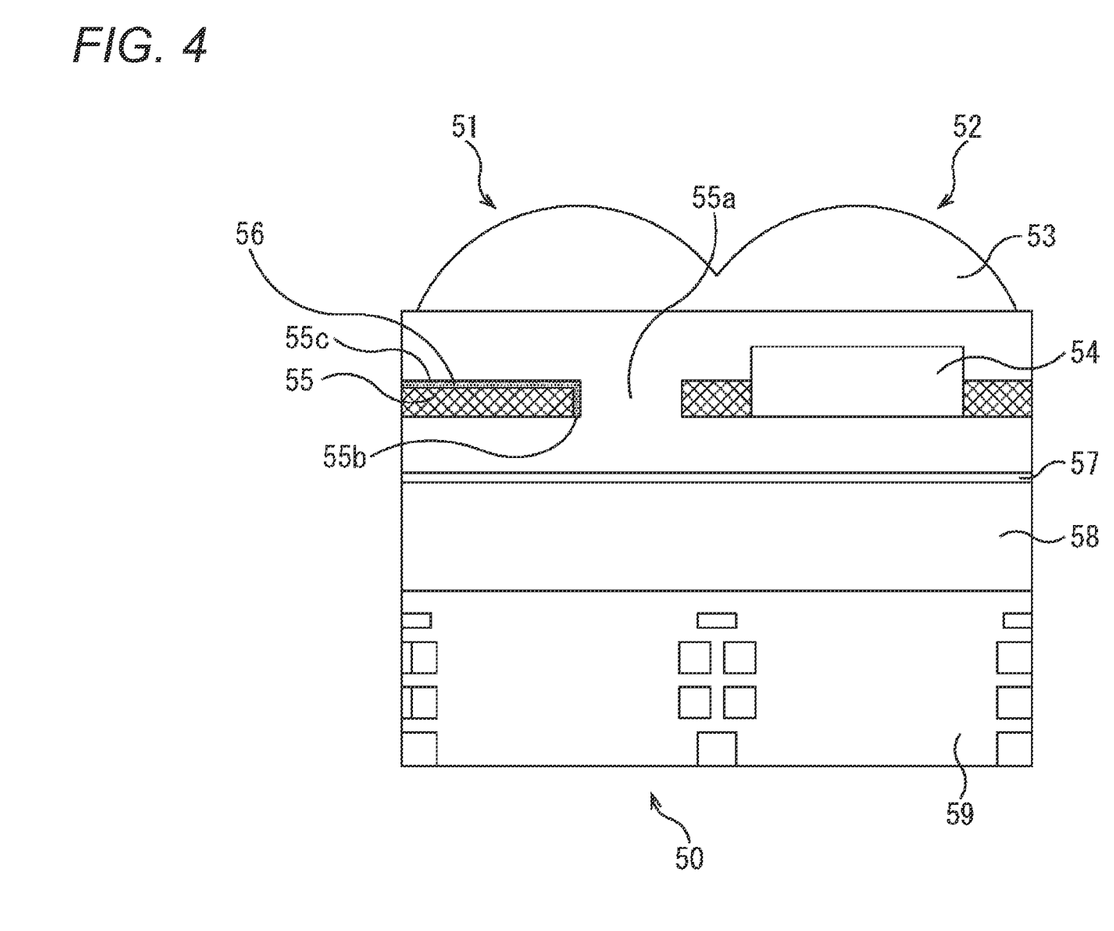
FIG. 4 is a cross-sectional block diagram showing a first example structure of a back-illuminated CIS to which the present disclosure is applied.

FIG. 4 is a cross-sectional block diagram showing a first example structure of a back-illuminated CIS as the embodiment in which a phase difference detection pixel is provided. In this drawing, the left side shows a phase difference detection pixel 51, and the right side shows a normal pixel 52.

The phase difference detection pixel 51 and the normal pixel 52 each include an on-chip lens 53, an antireflection layer 57, a photoelectric conversion layer 58, and an interconnect layer 59, in this order from the upper layer side (the light incidence surface side).

In the phase difference detection pixel 51, a light blocking layer 55 having an apertural portion 55a that is an aperture deviating from the optical axis of the on-chip lens 53 is provided between the on-chip lens 53 and the antireflection layer 57.

The light blocking layer 55 is made of a metal material such as W (tungsten) that blocks incident light. The sidewall surface 55b and the upper surface 55c of the light blocking layer 55 are processed into an antireflection film 56 made of an oxide metal such as WOx through an oxidation treatment performed on the metal material.

Meanwhile, in the normal pixel 52, a color filter 54 is provided between the on-chip lens 53 and the antireflection layer 57. The color filter 54 may also be provided in the phase difference detection pixel 51.

In the phase difference detection pixel 51, incident light may enter the sidewall surface 55b of the light blocking layer 55. However, reflection of incident light is restrained, as the sidewall surface 55b is processed into the antireflection film 56. Thus, the reflected light can be restrained from entering the photoelectric conversion layer 58, and degradation of the phase difference detection performance of the phase difference detection pixel 51 and color mixing in the adjacent normal pixel 52 can be reduced.

Also, as the upper surface 55c of the light blocking layer 55 is also processed into the antireflection film 56, stray light due to reflection of incident light at the upper surface 55c of the light blocking layer 55 can also be reduced.

Second Example Structure of a Back-Illuminated CIS as the Embodiment

Figure 5:
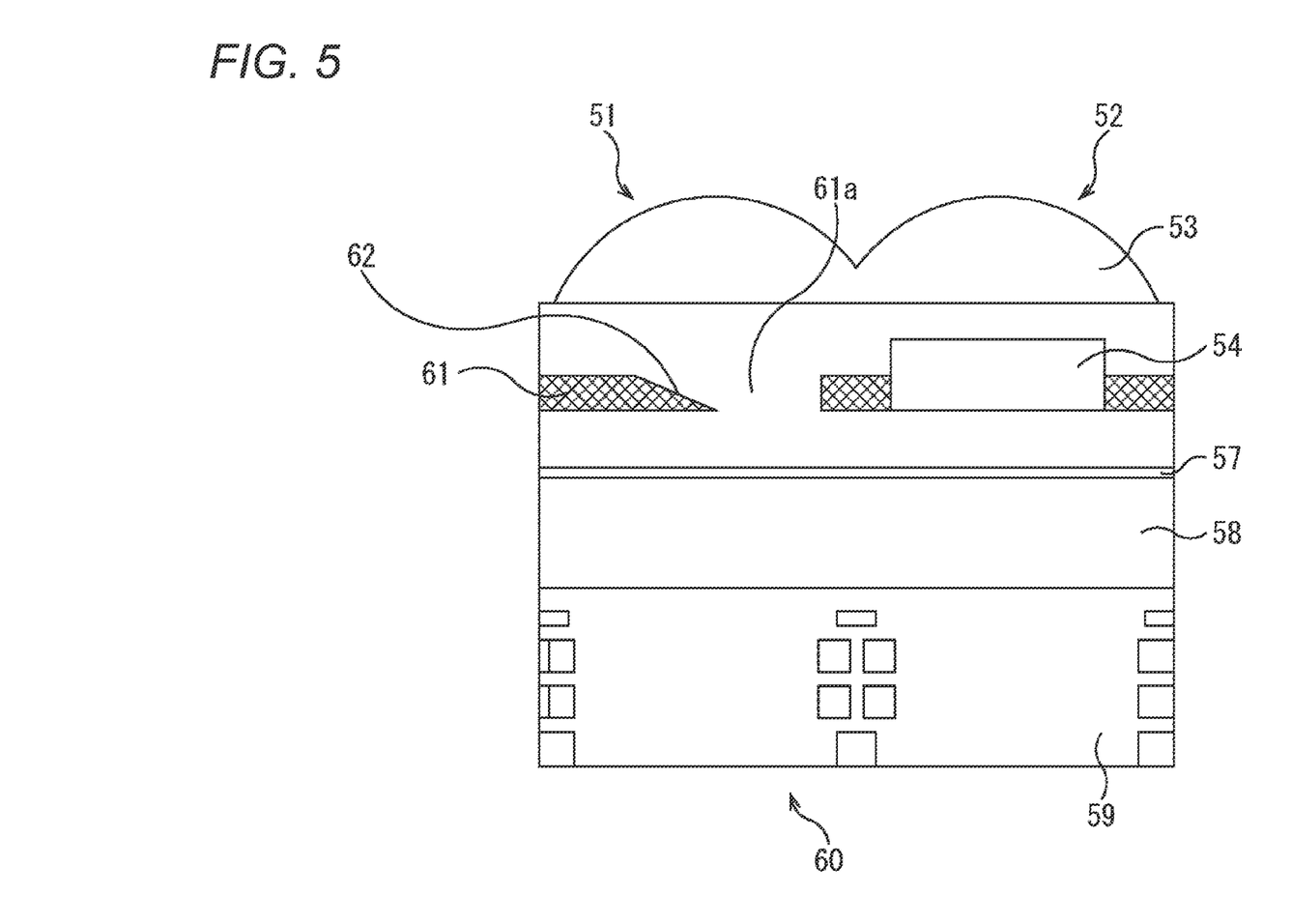
FIG. 5 is a cross-sectional block diagram showing a second example structure of a back-illuminated CIS to which the present disclosure is applied.

FIG. 5 is a cross-sectional block diagram showing a second example structure of a back-illuminated CIS as the embodiment in which a phase difference detection pixel is provided. The common components between the back-illuminated CIS 60 and the back-illuminated CIS 50 as the first example structure shown in FIG. 4 are denoted by the same reference numerals between the two drawings, and therefore, explanation of them will not be repeated.

In the phase difference detection pixel 51 of the back-illuminated CIS 60 as the second example structure, a light blocking layer 61 having an apertural portion 61a that is an aperture deviating from the optical axis of the on-chip lens 53 is provided between the on-chip lens 53 and the antireflection layer 57.

The light blocking layer 61 is made of a metal material such as W that blocks incident light. The light blocking layer 61 has a tapered portion 62 that becomes thinner in the direction toward the apertural portion 61a.

As the tapered portion 62 is formed in the light blocking layer 61, vignetting is restrained, and photosensitivity is increased in the phase difference detection pixel 51. Furthermore, as the area of the sidewall surface of the light blocking layer 61 is smaller, reflection of incident light at the sidewall surface can be reduced. Thus, degradation of the phase difference detection performance of the phase difference detection pixel 51 and color mixing in the adjacent normal pixel 52 can be reduced.

Third Example Structure of a Back-Illuminated CIS as the Embodiment

Figure 6:
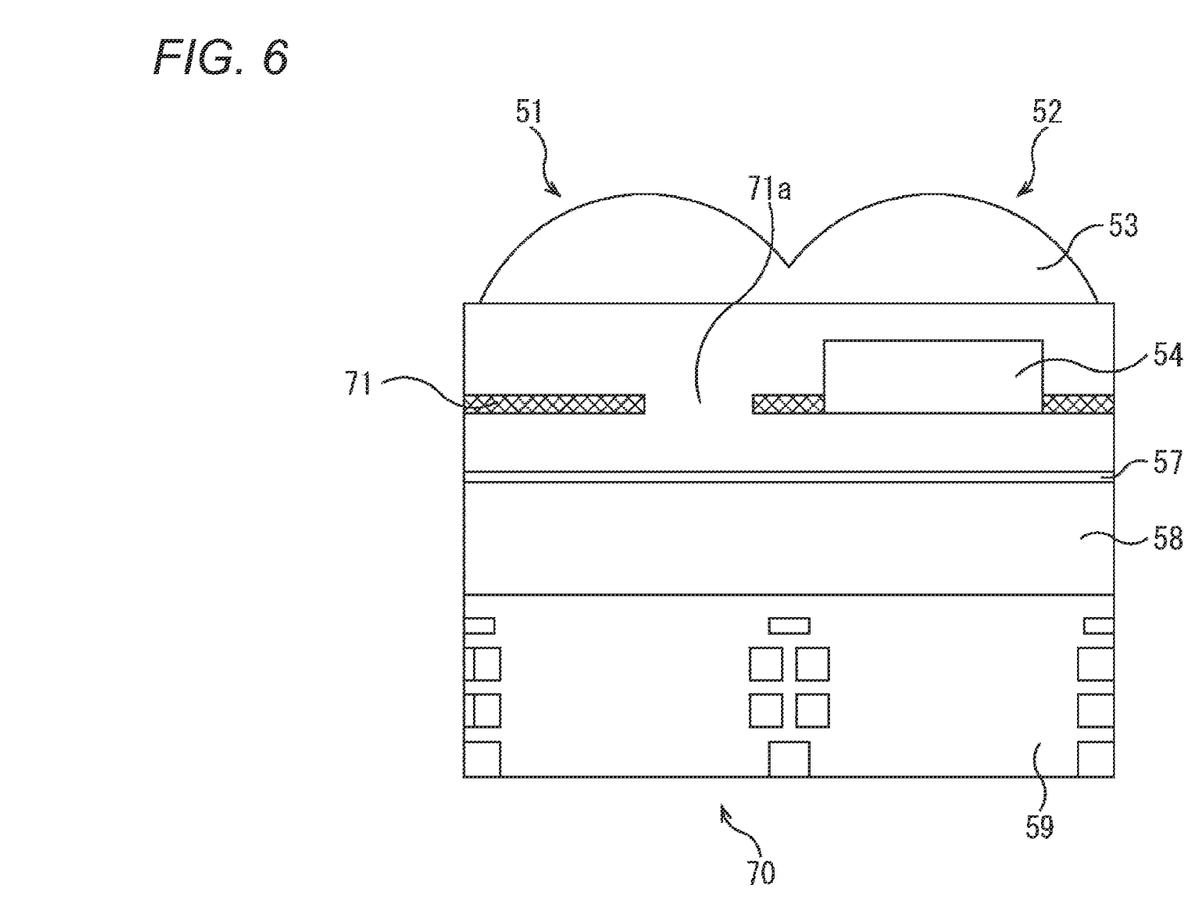
FIG. 6 is a cross-sectional block diagram showing a third example structure of a back-illuminated CIS to which the present disclosure is applied.

FIG. 6 is a cross-sectional block diagram showing a third example structure of a back-illuminated CIS as the embodiment in which a phase difference detection pixel is provided. The common components between the back-illuminated CIS 70 and the back-illuminated CIS 50 as the first example structure shown in FIG. 4 are denoted by the same reference numerals between the two drawings, and therefore, explanation of them will not be repeated.

In the phase difference detection pixel 51 of the back-illuminated CIS 70 as the third example structure, a light blocking layer 71 having an apertural portion 71a that is an aperture deviating from the optical axis of the on-chip lens 53 is provided between the on-chip lens 53 and the antireflection layer 57.

The light blocking layer 71 is made of a metal material such as W that blocks incident light, and has a smaller thickness than the light blocking layer provided in each normal pixel in the OPB region (not shown) of the back-illuminated CIS 70.

As the light blocking layer 71 is thin, vignetting is restrained, and photosensitivity is increased in the phase difference detection pixel 51. Furthermore, as the area of the sidewall surface of the light blocking layer 71 is smaller, reflection of incident light at the sidewall surface can be reduced. Thus, degradation of the phase difference detection performance of the phase difference detection pixel 51 and color mixing in the adjacent normal pixel 52 can be reduced.

Fourth Example Structure of a Back-Illuminated CIS as the Embodiment

Figure 7:
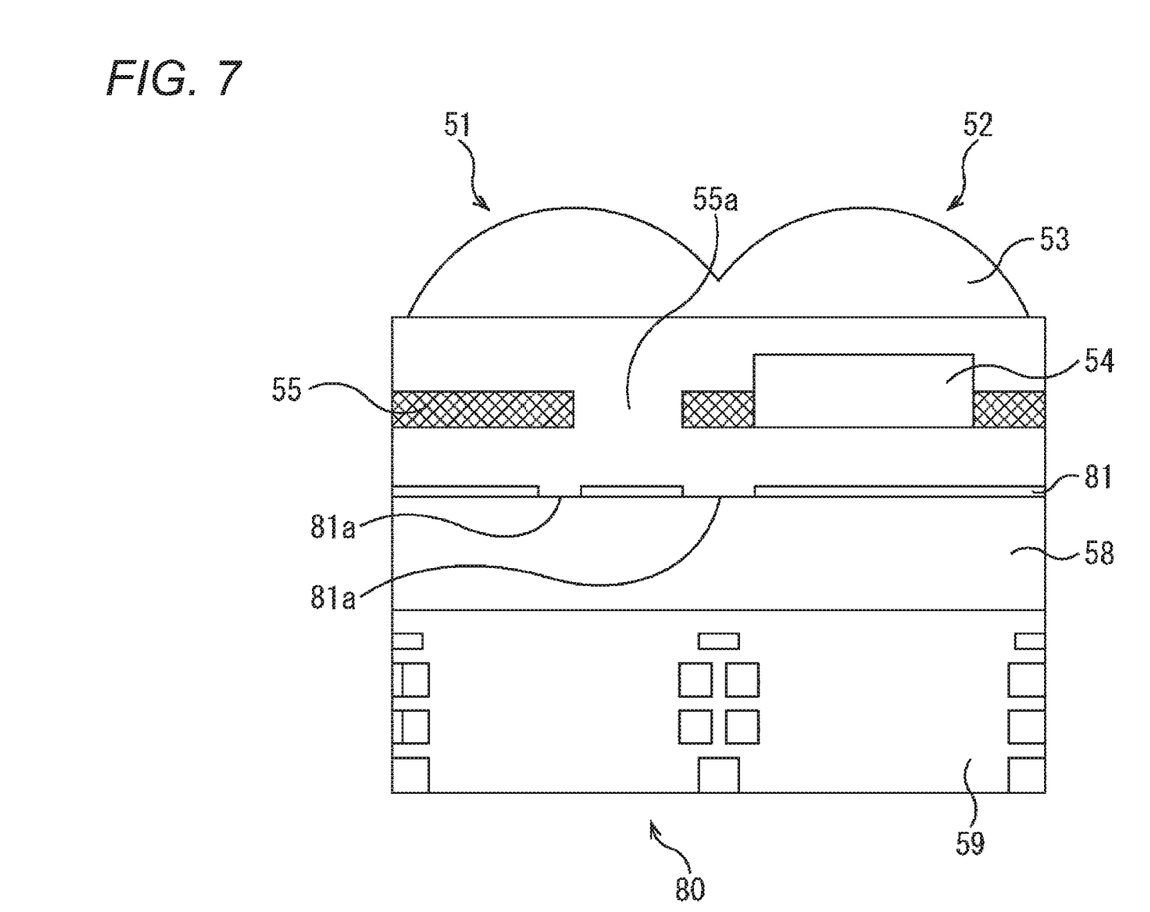
FIG. 7 is a cross-sectional block diagram showing a fourth example structure of a back-illuminated CIS to which the present disclosure is applied.

FIG. 7 is a cross-sectional block diagram showing a fourth example structure of a back-illuminated CIS as the embodiment in which a phase difference detection pixel is provided. The common components between the back-illuminated CIS 80 and the back-illuminated CIS 50 as the first example structure shown in FIG. 4 are denoted by the same reference numerals between the two drawings, and therefore, explanation of them will not be repeated.

In the phase difference detection pixel 51 of the back-illuminated CIS 80 as the fourth example structure, an antireflection layer 81 is formed on the upper surface of the photoelectric conversion layer 58. The antireflection layer 81 has portions selectively removed (removed portions 81a).

As the removed portion 81a is formed in the antireflection layer 81 in the phase difference detection pixel 51, reflected light and the like that should be prevented from entering the photoelectric conversion layer 58 can be reflected by the removed portion 81a. Thus, degradation of the phase difference detection performance of the phase difference detection pixel 51 and color mixing in the adjacent normal pixel 52 can be reduced.

SUMMARY

The above described back-illuminated CISs 50, 60, 70, and 80 can be combined as appropriate. For example, the surface of the light blocking layer 61 of the back-illuminated type 60, the light blocking layer 71 of the back-illuminated type 70, or the like may be processed into an antireflection film through an oxidation treatment, or the antireflection layer 81 having the removed portions 81a of the back-illuminated type 80 may be provided in the back-illuminated CIS 50, 60, or 70.

The back-illuminated CISs 50, 60, 70, and 80 of this embodiment can be used in electronic apparatuses of any kind having an imaging function, not to mention imaging apparatuses such as cameras.

The present disclosure can be applied not only to back-illuminated CISs but also to surface-illuminated CISs. Back-illuminated CISs and surface-illuminated CISs to which the present disclosure is applied may be of either a three-transistor type or a four-transistor type.

Further, the present disclosure may be applied to multi-pixel sharing CISs in which pixels share an electrode, an FD, and the like.

The present disclosure may also be applied to stacked CIS in which a substrate having a sensor circuit formed thereon and a substrate having a logic circuit formed thereon are stacked.

It should be noted that embodiments of the present disclosure are not limited to the above described embodiment, and various modifications may be made to the above embodiment without departing from the scope of the present disclosure.

The present disclosure can be embodied in the following structures.

(1)
A solid-state imaging device including:
a normal pixel for generating a pixel signal; and
a phase difference detection pixel for generating a phase difference signal for image plane phase difference AF,
wherein
the normal pixel and the phase difference detection pixel each include a photoelectric conversion layer and a lens for gathering incident light onto the photoelectric conversion layer,
the phase difference detection pixel includes a light blocking layer having an apertural portion with an aperture deviating from the optical axis of the lens, and an antireflection portion that prevents reflection of the incident light gathered by the lens unit is formed on the light blocking layer.

(2)

The solid-state imaging device of (1), wherein the antireflection portion is an antireflection film formed on the sidewall surface of the light blocking layer facing the apertural portion.

(3)

The solid-state imaging device of (2), wherein the antireflection portion is the antireflection film further formed on the upper surface of the light blocking layer on the side of the lens.

(4)

The solid-state imaging device of (2) or (3), wherein
the light blocking layer is made of a metal, and
the antireflection film is made of a metal oxide formed by subjecting the metal to an oxidation treatment.

(5)

The solid-state imaging device of any one of (2) to (4), wherein
the light blocking layer is made of W, and
the antireflection film is made of WOx formed by subjecting the W to an oxidation treatment.

(6)

The solid-state imaging device of (1), wherein the antireflection portion is a tapered portion in which the light blocking layer becomes thinner in the direction toward the apertural portion.

(7)

The solid-state imaging device of any one of (1) to (6), wherein
the normal pixel and the phase difference detection pixel each further include an antireflection layer on the upper surface of the photoelectric conversion layer on the side of the lens, and
the antireflection layer of the phase difference detection pixel has a removed portion that is a portion selectively removed.

(8)

The solid-state imaging device of any one of (1) to (7), wherein the light blocking layer is thinner than a light blocking film formed in an OPB region.

(9)

The solid-state imaging device of any one of (1) to (8), wherein the solid-state imaging device is of a back-illuminated type.

(10)

An electronic apparatus equipped with a solid-state imaging device,
the solid-state imaging device including:
a normal pixel for generating a pixel signal; and
a phase difference detection pixel for generating a phase difference signal for image plane phase difference AF,
wherein
the normal pixel and the phase difference detection pixel each include a photoelectric conversion layer and a lens for gathering incident light onto the photoelectric conversion layer,
the phase difference detection pixel includes a light blocking layer having an apertural portion with an aperture deviating from the optical axis of the lens, and
an antireflection portion that prevents reflection of the incident light gathered by the lens unit is formed on the light blocking layer.

REFERENCE SIGNS LIST

50 Back-illuminated CIS
51 Phase difference detection pixel
52 Normal pixel
53 On-chip lens
54 Color filter
55 Light blocking film
51B Sidewall surface
56 Antireflection film
57 Antireflection layer
58 Photoelectric conversion layer
59 Interconnect layer
60 Back-illuminated CIS
61 Light blocking layer
62 Tapered portion
70 Back-illuminated CIS
71 Light blocking layer
80 Back-illuminated CIS
81 Antireflection layer
81a Removed portion

The invention claimed is:

1. A solid-state imaging device, comprising:
a normal pixel to generate a pixel signal; and
a phase difference detection pixel to generate a phase difference signal for image plane phase difference automatic focus (AF), wherein
each of the normal pixel and the phase difference detection pixel includes a lens, a first antireflection portion, a photoelectric conversion layer, and an interconnect layer, in this order from a light incidence surface side of the solid-state imaging device,
the lens is configured to gather incident light onto the photoelectric conversion layer,
the normal pixel includes a color filter between the lens and the first antireflection portion, and
the phase difference detection pixel further includes:
a light blocking layer having an apertural portion with an aperture, wherein
the color filter is in direct contact with the light blocking layer,
the light blocking layer comprises a metal, and
a center of the aperture is deviated from an optical axis of the lens, and
a second antireflection portion on each of a first surface of the light blocking layer and a sidewall surface of the light blocking layer, wherein
the second antireflection portion comprises a metal oxide,
the metal oxide of the second antireflection portion is an oxide of the metal of the light blocking layer,
the sidewall surface of the light blocking layer faces the apertural portion of the light blocking layer,
the first surface of the light blocking layer is perpendicular to the sidewall surface,
the second antireflection portion is configured to prevent reflection of the incident light gathered by the lens,
the first antireflection portion is between the photoelectric conversion layer and a second surface of the light blocking layer opposite to the first surface of the light blocking layer, and
the first antireflection portion is in contact with the photoelectric conversion layer.

2. The solid-state imaging device according to claim 1, wherein the second antireflection portion is an antireflection film.

3. The solid-state imaging device according to claim 1, wherein the first surface of the light blocking layer faces the lens.

4. The solid-state imaging device according to claim 1, wherein
the light blocking layer comprises Tungsten (W), and
the second antireflection portion comprises Tungsten Oxide (WOx).

5. The solid-state imaging device according to claim 1, wherein the solid-state imaging device is of a back-illuminated type.

6. An electronic apparatus, comprising:
a solid-state imaging device,
wherein the solid-state imaging device includes:
a normal pixel to generate a pixel signal; and
a phase difference detection pixel to generate a phase difference signal for image plane phase difference automatic focus (AF), wherein
each of the normal pixel and the phase difference detection pixel includes a lens, a first antireflection portion, a photoelectric conversion layer, and an interconnect layer, in this order from a light incidence surface side of the solid-state imaging device,
the lens is configured to gather incident light onto the photoelectric conversion layer,
the normal pixel includes a color filter between the lens and the first antireflection portion, and
the phase difference detection pixel further includes:
a light blocking layer having an apertural portion with an aperture, wherein
the color filter is in direct contact with the light blocking layer,
the light blocking layer comprises a metal, and
a center of the aperture is deviated from an optical axis of the lens, and
a second antireflection portion on each of a first surface of the light blocking layer and a sidewall surface of the light blocking layer, wherein
the second antireflection portion comprises a metal oxide,
the metal oxide of the second antireflection portion is an oxide of the metal of the light blocking layer,
the sidewall surface of the light blocking layer faces the apertural portion of the light blocking layer,
the first surface of the light blocking layer is perpendicular to the sidewall surface,
the second antireflection portion is configured to prevent reflection of the incident light gathered by the lens,
the first antireflection portion is between the photoelectric conversion layer and a second surface of the light blocking layer opposite to the first surface of the light blocking layer, and
the first antireflection portion is in contact with the photoelectric conversion layer.

* * * * *